(12) United States Patent
Booij et al.

(10) Patent No.: US 11,875,089 B2
(45) Date of Patent: Jan. 16, 2024

(54) ACOUSTIC POSITIONING TRANSMITTER AND RECEIVER SYSTEM AND METHOD

(71) Applicant: Sonitor Technologies AS, Oslo (NO)

(72) Inventors: Wilfred Edwin Booij, Oslo (NO); Knut Welle, Oslo (NO); Mattheus Franciscus Albertus Ten Veldhuis, Oslo (NO); Fritjof Boger Engelhardtsen, Oslo (NO)

(73) Assignee: Sonitor Technologies AS, Oslo (NO)

( * ) Notice: Subject to any disclaimer, the term of this patent is extended or adjusted under 35 U.S.C. 154(b) by 274 days.

(21) Appl. No.: 16/288,606

(22) Filed: Feb. 28, 2019

(65) Prior Publication Data

US 2019/0272348 A1  Sep. 5, 2019

Related U.S. Application Data

(60) Provisional application No. 62/637,518, filed on Mar. 2, 2018.

(51) Int. Cl.
*G06F 30/13* (2020.01)
*G01S 5/18* (2006.01)
(Continued)

(52) U.S. Cl.
CPC ........... *G06F 30/13* (2020.01); *G01S 1/725* (2013.01); *G01S 1/763* (2013.01); *G01S 1/78* (2013.01);
(Continued)

(58) Field of Classification Search
CPC ......... G06F 30/13; G06F 30/00; G01S 1/725; G01S 1/763; G01S 1/78; G01S 5/18; G01S 5/183; G01S 15/523
(Continued)

(56) References Cited

U.S. PATENT DOCUMENTS

2012/0113224 A1* 5/2012 Nguyen ............... G06T 7/55
348/46

FOREIGN PATENT DOCUMENTS

EP           2 679 042 B1    12/2017
WO     WO-2004049299 A1 *  6/2004  ............... G10H 1/00

OTHER PUBLICATIONS

Zhou, Bing et al., "BatMapper: Acoustic Sensing Based Indoor Floor Plan Construction using Smartphones", Jun. 19-23, 2017, MobiSys '17, ACM. (Year: 2017).*

(Continued)

*Primary Examiner* — Cedric Johnson
(74) *Attorney, Agent, or Firm* — Sterne, Kessler, Goldstein & Fox P.L.L.C.

(57) ABSTRACT

An acoustic model determination approach for a real-time locating system is disclosed. The system includes one or more transmitting devices and one or more mobile devices. The acoustic model may be determined by deriving an acoustic representation of sub-structures within the building, and then forming the acoustic model based on the acoustic representation and the location and orientation of the static acoustic transmitting device. In another embodiment, an acoustic signal is transmitted from a static acoustic transmitting device, with the reflected signals received by the same static acoustic transmitting device in a receiving mode. Based on these received acoustic signals, the acoustic model is formed based on the reflected signals and the location and orientation of the static acoustic transmitting device.

20 Claims, 4 Drawing Sheets

(51) Int. Cl.
    *G01S 15/52* (2006.01)
    *G01S 1/76* (2006.01)
    *G01S 1/78* (2006.01)
    *G01S 1/72* (2006.01)

(52) U.S. Cl.
    CPC .............. *G01S 5/18* (2013.01); *G01S 5/183* (2013.01); *G01S 15/523* (2013.01)

(58) Field of Classification Search
    USPC .......................................................... 703/1
    See application file for complete search history.

(56) References Cited

OTHER PUBLICATIONS

Suarez, Rafael et al., "Archaeoacoustics of Intangible Cultural Heritage: The Sound of the Maior Ecclesia of Cluny", Jan. 18, 2016, Journal of Cultural Heritage 19, Elsevier Masson SAS. (Year: 2016).*

Rollins, Sarah, "Acoustics of the Salt Lake Tabernacle: Characterization and Study of Spatial Variation", Nov. 11, 2005, Thesis and Dissertations, Brigham Young University. (Year: 2005).*

Zhang, Ying et al, "A Walk-Through System for Building Acoustics Evaluation Based on Virtual Environment Technology", 2002, IEEE ICIT '02, IEEE. (Year: 2002).*

Lopes, Sergio Ivan Fernandes, "In Search of Reliable Centimeter-Level Indoor Positioning. A Smartphone-based Approach", 2014, Universidade de Aveiro. (Year: 2014).*

Aguilar Herrera, J.C. et al., "The Construction of an Indoor Floor Plan using a Smartphone for Future Usage of Blind Indoor Navigation", Oct. 27-30, 2014, 2014 International Conference on Indoor Positioning and Indoor Navigation, IEEE. (Year: 2014).*

Sankar, Aditya et al., "Capturing Indoor Scenes with Smartphones", Oct. 7-10, 2012, UIST '12, ACM. (Year: 2012).*

International Search Report, dated Sep. 9, 2019 for Appl. No. PCT/IB2019/051626, 5 pages.

Written Opinion, dated Sep. 9, 2019 for Appl. No. PCT/IB2019/051626, 9 pages.

Invitation to Pay Additional Fees, dated Jul. 9, 2019 for Appl. No. PCT/IB2019/051626, 9 pages.

* cited by examiner

ACOUSTIC POSITIONING TRANSMITTER AND RECEIVER SYSTEM AND METHOD

CROSS REFERENCE TO RELATED APPLICATIONS

This application claims the benefit of U.S. Provisional Application No. 62/637,518, filed Mar. 2, 2018 and entitled "Acoustic Positioning Transmitter and Receiver System and Method," which is incorporated herein by reference in its entirety.

FIELD

The present disclosure relates generally to real-time locating systems and more particularly to acoustic positioning transmitter and receiver systems and methods for use in real-time locating systems.

BACKGROUND

In recent years, real-time locating systems, such as indoor positioning systems, have found increased popularity and application. It is known to provide room-level location using static ultrasonic transmitters at known locations within an environment such as a building or other structure. It is desirable to provide this room-level location in a cost effective manner.

SUMMARY

Aspects and advantages of embodiments of the present disclosure will be set forth in part in the following description, or may be learned from the description, or may be learned through practice of the embodiments.

One example aspect of the present disclosure is directed to a computer-implemented method for determining an acoustic model of a building for use in an acoustic real-time locating system. This method includes deriving an acoustic representation of sub-structures within the building, together with determining a location and orientation of a static acoustic transmitting device. This method also includes forming the acoustic model based on the acoustic representation and the location and orientation of the static acoustic transmitting device.

Another example aspect of the present disclosure is directed to a computer-implemented method for determining an acoustic model of a room within a building for use in an acoustic real-time locating system. This method includes transmitting an acoustic signal from a static acoustic transmitting device, together with receiving, at the static acoustic transmitting device, reflected signals resulting from interactions of the acoustic signal with structures forming the room. This method further includes receiving a location and orientation of a static acoustic transmitting device, and also forming the acoustic model based on the reflected signals and the location and orientation of the static acoustic transmitting device.

Other aspects of the present disclosure are directed to systems, apparatus, tangible, non-transitory computer-readable media, user interfaces, and devices for providing real-time location.

These and other features, aspects, and advantages of various embodiments will become better understood with reference to the following description and appended claims. The accompanying drawings, which are incorporated in and constitute a part of this specification, illustrate embodiments of the present disclosure and together, with the description, serve to explain the related principles.

BRIEF DESCRIPTION OF THE DRAWINGS

Detailed discussion of embodiments directed to one of ordinary skill in the art is set forth in the specification, which makes reference to the appended figures, in which.

DETAILED DESCRIPTION

Reference will now be made in detail to embodiments, one or more examples of which are illustrated in the drawings. Each example is provided by way of explanation of the embodiments, not limitation of the invention. In fact, it will be apparent to those skilled in the art that various modification and variations can be made to the embodiments without departing from the scope or spirit of the present disclosure. For instance, features illustrated or described as part of one embodiment can be used with another embodiment to yield a still further embodiment. Thus it is intended that aspects of the present disclosure cover such modifications and variations.

Real-time location systems have been developed using various wireless protocols, with perhaps the best known system being the global positioning system (GPS). While such location systems provide horizontal location accuracies of the order of approximately 8 meters, such systems do not address all location scenario requirements. For example, many scenarios demand location accuracies of better than 0.3 meters. Other scenarios require vertical accuracies that distinguish between floors in a high rise building. Still other scenarios require contextual location information, such as room-based information in an office building.

In response to these demanding location requirements, embodiments of the present disclosure provide solutions to these requirements. Acoustic signals may be used to determine the location of mobile units, or tags, in three dimensions by transmitting signals from a plurality of transmitting devices (which may be fixed to the walls or ceilings of a building). The acoustic signals may include encoded identifiers of the respective transmitting devices. These acoustic signals can be received by mobile computing devices. If the locations of the static transmitting devices are known, various characteristics of a set of acoustic signals received by the mobile computing devices can be used to estimate the location of each mobile device in the environment, using various suitable geometric calculations.

For instance, example aspects of the present disclosure are directed to determining a location of a mobile computing device associated with an acoustic real-time locating system. For instance, the mobile computing device can receive acoustic signals from one or more transmitting devices associated with the real-time locating system. The mobile computing device may select a set of signal peaks (e.g. two signal peaks) from the received acoustic signals, and may assign a first set of transmitter locations with each peak of the selected set of peaks. The transmitter locations can be defined in an acoustic model of an environment in which the one or more transmitting devices are located. Each transmitter location specified in the acoustic model can signify a location of a physical or "virtual" transmitting device located within the environment. The locations of virtual transmitters having been determined through a process of mirroring of a real location transmitter by a building's structure such as walls, ceilings etc. The mobile computing device may compare a first model path trace associated with the first set of transmitter locations to the received acoustic signals. The mobile computing device may then estimate a location of the mobile computing device based at least in part on the comparison of the first model path trace to the received acoustic signals.

More particularly, the real-time locating system can include one or more acoustic transmitting devices deployed throughout an environment, such as a campus, building, room, space, area, etc. For instance, the transmitting devices can be deployed throughout a hospital, warehouse, etc. to facilitate a location determination of equipment, objects, inventory, people, etc. located within the hospital, warehouse, etc. The transmitting devices may be configured to, at various intervals (e.g. periodically), transmit acoustic (e.g. ultrasonic) positioning signals within the environment. For instance, the acoustic signals may be signals having a frequency from about 20 kHz to about 40 kHz. As used herein, the term "about," when used in reference to a numerical value is intended to refer to within 30% of the numerical value. As indicated, the acoustic signals can be received by one or more mobile computing devices located within a broadcast range of the transmitting devices, and can be used to facilitate an estimation of a location of the respective mobile computing device(s) within the environment.

Upon receiving acoustic signals from a transmitting device, the mobile computing device may estimate a location of the mobile computing device based at least in part on an acoustic model of an environment in which the mobile computing device and the transmitting device are located. More particularly, the acoustic model may correspond to a particular room, area, space, etc. in which the mobile computing device and/or the transmitting device is located. The acoustic model may specify a plurality of transmitter locations within the environment. The transmitter locations can correspond to one or more physical transmitting devices and one or more "virtual" transmitting devices. In particular, the acoustic model may model one or more reflection points within the environment as "virtual" transmitting devices that can be interpreted as physical transmitting devices for purposes of location estimation according to example aspects of the present disclosure. The modeled transmitter locations are dependent on the location of the physical transmitting device and the dimensional specifications of the reflective surfaces of the environment in which the transmitting devices are located. Such reflective surfaces can include walls, floors, ceilings, objects, items, furniture, etc. located within the environment that can reflect the acoustic signals transmitted by a physical transmitting device. The transmitter location(s) representing virtual transmitters may correspond to points of reflection within the environment at which the acoustic signal is reflected by a reflective surface. The transmitter location(s) representing physical transmitting device(s) may correspond to the actual location(s) of the physical transmitting device(s) within the environment.

In this manner, the acoustic model may represent the reflective surfaces within the environment as acoustic mirrors. In some implementations, an attenuation of the reflective surfaces can be accounted for based at least in part on the materials of the reflective surfaces. The attenuation factor of such reflective surfaces can generally be in the order of between about 1 dB to about 10 dB, depending at least in part on the acoustic properties of the material of the reflective surface. The acoustic model can represent any reflective surface within the environment. For instance, as indicated, large reflective surfaces such as walls, ceilings, floors, etc. can be represented. Similarly, smaller, more minor reflective surfaces such as furniture, picture frames, light fixtures, ceiling fans, etc. can also be represented.

The transmitter locations specified by the acoustic model may be dependent on the dimensional specifications of the modeled reflective surfaces within the environment. The dimensional specifications may include data indicative of the location, size, orientation (e.g. direction normal), attenuation, and/or other suitable characteristic of the reflective surfaces. In this manner, the acoustic model may accurately represent reflection points (e.g. transmitter locations) on the reflective surfaces.

The acoustic model can include any suitable number of transmitter locations (e.g. representing physical transmitting device(s) and virtual transmitting device(s)). In addition, the acoustic model can represent transmitter locations associated with $1^{st}$ order reflections, $2^{nd}$ order reflections, $3^{rd}$ order reflections, etc. As used herein, the order of reflections (e.g. $1^{st}$ order, $2^{nd}$ order, etc.) corresponds to the number of times that the acoustic signal associated with a particular transmitter location is reflected by a reflective surface. In this manner, a $1^{st}$ order transmitter location may represent a virtual transmitting device associated with an acoustic signal, such that the signal will have been reflected by one reflective surface prior to reaching the mobile computing device. The transmitter location may represent the reflection point on a reflective surface at which the signal was reflected. As another example, a $2^{nd}$ order transmitter location may represent a virtual transmitting device associated with an acoustic signal, such that the signal will have been reflected by two reflective surfaces prior to reaching the mobile computing device. The transmitter location may represent the reflection point on the second (e.g. the last) reflective surface at which the signal was reflected prior to reaching the mobile computing device. Similarly, a $0^{th}$ order transmitter location may represent a physical transmitting device, such that an acoustic signal received by a mobile computing device associated with the $0^{th}$ order transmitter location will have been reflected by zero reflective surfaces (e.g. will have propagated directly from the physical transmitting device to the mobile computing device).

It can be advantageous to limit the overlap of reflected signals used to define the acoustic model. For instance, signals transmitted by the transmitting device can be reflected by one or more reflective surfaces in the environment in which the transmitting device is located. Such reflected signals may overlap such that they are not distinguishable, which can prevent the transmitter locations associated with such reflected signals from being individually distinguishable. Such reflections may cause signal interference, which can potentially render the signals involved, or a subset thereof, indistinguishable from one another. Such interference effects are strongest when the differential difference between paths are less than for example a chip length, in the case of phase shift keyed signals. For instance, the higher order reflections may be more likely to overlap and cause signal interference. Accordingly, it can be beneficial to limit the likelihood of signal interference, such that each transmitter location specified in the acoustic model is individually distinguishable. In this manner, it can be advantageous to manipulate the number and positions of the transmitter locations to reduce such signal interference. The number of transmitter locations specified by the acoustic model can be dependent on the physical transmitting device(s) in the environment associated with the acoustic model. Similarly, the positions of the transmitter locations can also be dependent on the physical transmitting device(s). For instance, the location and orientation of the transmitting device can affect the number of and position of the transmitter locations. Similarly, the directivity of the transducer of the transmitting device can affect the number and position of transmitter locations. In this manner, a user can position and orient the transmitting device to reduce the number of transmitter locations specified by the acoustic model, as well as to manipulate the positions of the transmitter locations. Similarly, the user can choose particular transducer properties (e.g. directivity) to reduce the number of transmitter locations. As an example, positioning a physical transmitting device on or near a corner of a ceiling in a four-walled room can result in a greater number of distinguishable transmitter locations specified by the acoustic model, which can result in a more reliable acoustic environment. The uniqueness of such a placement of a transmitter device may also be determined at least in part by the accuracy at which the orientation of the receiving mobile computing device can be estimated.

The acoustic model may be generated prior to and without regard of the presence of a mobile computing device within the modeled environment. In this manner, the transmitter locations specified by the acoustic model are determined independently of the location of the mobile computing device. As will be described in greater detail below, upon entry of a mobile computing device into the environment and receipt of the acoustic signals, the mobile computing device can estimate the location of the mobile computing device based at least in part on the known transmitter locations as specified by the acoustic model.

More particularly, upon entry into an environment having a transmitting device(s), the mobile computing device can receive acoustic signals from the transmitting device(s). Such received signals may correspond to a signal propagating directly from the transmitting device(s) to the mobile computing device, as well as to one or more signals that have been reflected by a reflective surface within the environment. In this regard, the received acoustic signals can represent the measured acoustic response of the environment (e.g. room) with respect to the acoustic signals transmitted by transmitting device(s) and received by the mobile computing device; the received acoustic signal representing the convolution of the room response function with the transmitted acoustic signals. The location of the mobile computing device may be estimated based at least in part on the received acoustic signals and an acoustic model representing the environment.

INTRODUCTION

As noted above, acoustic (e.g., ultrasound) signals are well suited for indoor positioning of mobile devices such as tags, mobile phones, tablets, etc. The capability to estimate the Time of Arrival (TOA) or Time of Flight (TOF) easily using low cost infrastructure is very attractive compared to approaches that rely on RF-based technologies. As the inventors have noted, the built-in audio capabilities of many mobile devices may also be leveraged (see previous applications, such as U.S. application Ser. No. 15/858,700 filed Dec. 29, 2017; U.S. application Ser. No. 15/858,893 filed Dec. 29, 2017; U.S. application Ser. No. 15/858,845 filed Dec. 29, 2017; and U.S. application Ser. No. 15/858,683 filed Dec. 29, 2017, all of which are incorporated by reference in their entirety) with this objective in mind. The inventors have noted that the positioning of mobile devices using acoustic signals (e.g., ultrasound) may also be done using far fewer infrastructure units (ultrasound transmitters) than using alternate technologies. This reduction in infrastructure requirements results from the use made of the near ideal reflective properties of the building structure within in the indoor environment (primarily walls, ceilings but also a mobile surface can be used). The inventors have noted that by modeling these structures as acoustic mirrors with known attenuation properties, an innovative positioning method may be used. This positioning method does not require line-of-sight, and in small rooms, this positioning method requires only a single transducer that transmits acoustic signals. The mirroring effect gives rise to virtual copies of the physically installed acoustic transmitter that may be leveraged for positioning a mobile device in 1, 2 or 3 dimensions. Due to the reflections from the building structures, the mobile device receives echoes that are a part of the multi-path acoustic signal. These echoes may be leveraged by effectively assigning these echoes to virtual locations. Alternate methods were noted by the inventors that also use the magnitude and phase information of the multi-path signal to estimate the position of the mobile device. In some instances of these methods, the magnitude and phase information may be used in combination with the mobile device microphone orientation.

The above techniques effectively require detailed knowledge of the building structure and the position and orientation of the mounted acoustic transmitters. This knowledge may then be used to create a detailed acoustic model of the building and its constituent parts such as corridor, rooms, the open areas, and the like. To a large extent, the accuracy with which such an acoustic model may be created determines the reliability and accuracy of the mobile device's acoustic positioning method. Creation of the acoustic models of the indoor environment involves detailed and time consuming measurements using multiple microphones with well known orientation and properties as well as wideband acoustic sources with similar requirements. Such measurements may take hours to perform even for a single substructure in a building. Also such measurements tend to focus on the audible range of the acoustic frequency spectrum. Needless to say such measurements raise the cost of this indoor positioning system.

A new positioning system and method is described below that uses an approach that derives the acoustic building model by combining a number of techniques and a-priori information known about the building, as outlined below. The advantage of this approach is that it may generate a detailed acoustic model of the substructures (rooms, corridor, etc.) of a building in less than a minute. This detailed acoustic model may be generated as part of the installation process of the acoustic signal source.

An acoustic model for a building would capture the effects of the various substructures of the building. For example, a building may include the various substructures of the building, such as walls, ceiling, floor, rooms and the like that would contribute to acoustic models. Based on the acoustic effects of these substructures, the acoustic model captures these effects, including the extent, position, orientation and acoustic attenuation (at the carrier frequencies of the acoustic transmitter device) of the substructures that result in a static or a semi-static acoustic reflector such as walls, ceilings, floors, etc. (i.e., anything that makes up a static or semi-static acoustic reflector).

Thus, an acoustic model of a building would take into account the location, orientation, signal strength and other signal characteristics of all acoustic transmitters deployed within the building either with respect to a local origin within the building's substructure or to a local or global reference location. In certain embodiments, accuracies desired for positions and orientations may be: positional accuracy of a wall/ceiling better than 10 cm, and an orientation information better than 5 degrees.

To obtain the acoustic model, one significant aid that is often available in any modern building is a layout of all the floors detailing the locations of the walls and the doors. In the most rudimentary form such floorplans are unstructured pixel files in most cases with a relative scale indication. In the best case the building's architectural plans are available in the form of a CAD design file. In the latter case, very detailed information of all the walls and ceilings of the building may be directly obtained by parsing the CAD design file and creating an acoustic building model. In this step of using the CAD design file, the location, orientation and signal characteristics of the deployed acoustic transmitters are not yet known and remain to be determined with the required accuracy.

In scenarios where the floorplans are known to be inaccurate, or for example, consist solely of unstructured pixel files, embodiments of the present approach use the built-in video camera of a mobile device and its inertial measurement unit (IMU) to perform a survey of the rooms or an area where an acoustic transmitter is mounted. The survey obtains the required properties (position, extent and orientation) of the walls, ceilings, and the like. Augmented reality technology may be leveraged to perform this survey. Augmented reality technology is quickly emerging for use in the leading mobile device operating systems (e.g., Android, iOS). In various embodiments, the availability of this technology in these operating systems enables the inclusion of this capability in an installation tool (e.g., an application running on the mobile device). Such an inclusion may be accomplished by using software development kits (SDK), such as Apple's ARkit, and Google's ARcore and Tango. The Tango SDK also includes the use of structured infrared (IR) signals to scan objects, which allows for more accuracy and reliability than other approaches. Use of the same augmented reality-based technology approach also allows for the registration of the position and orientation of the acoustic transmitter device. This registration may be achieved through the use of an object template that allows for the recognition of the acoustic transmitter device in the video images taken by the mobile device.

Using the flexibility of the augmented reality SDKs, embodiments of the present approach may simultaneously obtain acoustic recordings of the transmitted signal of the mounted acoustic transmitter using the microphone of the mobile device. Using techniques described in earlier applications (such as U.S. application Ser. No. 15/858,700 filed Dec. 29, 2017, which is incorporated by reference in its entirety), such audio recordings may include ultrasonic signals and maybe used to calculate room response functions. Such room response functions may be used to aid the determination of the position of the mobile device, and also to further add to the accuracy of the registration of the acoustic building model. In certain embodiments, acoustic transmitter devices may also include a capability to receive the transmitted acoustic signals and the echoes of those transmitted acoustic signals. In some embodiments, this acoustic receive capability may be implemented using the same transducers that are used to transmit the acoustic signal, thereby providing a cost effective solution. In alternate embodiments, the acoustic receive capability may be implemented using a built-in microphone that provides performance advantages (e.g., better sensitivity). The capability to both send and receive acoustic signals is a well-known characteristic of piezo-electric transducers. A significant advantage of such piezo-electric transducers is the fact that they are highly resonant (bandwidth limited) and thereby deliver relatively high output signal voltages. The bandwidth limited nature of the piezo-electric transducers may also be leveraged to under-sample the received acoustic signal, thereby resulting in very low power consumption needed to process the received acoustic signal. This effect, known as alias mixing, allows embodiments of the present approach to sample the received acoustic signal at a lower sample rate that what would be expected. For example, the received acoustic signal may be sampled at $4/5$ of the carrier frequency and, with some trivial computational operations, a complex representation of the received signal (baseband) may be obtained. The net result of this is that the acoustic transmitter can obtain a room response of the acoustic environment at very low energy consumption.

In summary, by requiring the user to locate the acoustic transmitter device using a floormap (which may have limited accuracy (e.g., 1 m)), its orientation with respect to the room's walls, and have the user indicate which surface the acoustic transmitter device is mounted on, the room response function may now be used to accurately estimate the location of the acoustic transmitter with respect to the walls. The acoustic positioning techniques used here can be found in patent applications (such as the path assignment application filed by Dehns, U.S. application Ser. No. 15/858, 845 filed Dec. 29, 2017, all of which are incorporated by reference in their entirety). The acoustic transmit and receive technique using the acoustic transmitter device may also be used to verify the correctness of the dimensions of the building structures, as obtained from the CAD design file or by using the augmented reality techniques. In addition, embodiments may estimate the attenuation of the surfaces using the known signal characteristics of the piezo-electric transmitter such as signal strength and spatial sensitivities (in send and receive modes) from the magnitude of the reflection identified with particular surfaces. Note that all of these measurements may be enhanced significantly using the room response function of the mobile device taken simultaneously with the augment reality-based registration of the room.

Embodiments Having More than One Transducer

In some embodiments, the acoustic transmitter device is equipped with more than one acoustic transmitter. In such embodiments, all of the acoustic transmitter devices may be used to derive the position of the acoustic transmitter device within the acoustic environment, as well as to enrich the acoustic model. These additional capabilities may result in more robust and accurate results. For example, in embodiments where the multiple acoustic transmitter devices have different carrier frequencies, orientations and/or signal directivity, significant benefits result. Different carrier frequencies reduce the chance of destructive acoustic signal interference influencing the estimation processes. Different directivity allows one to distinguish between surfaces that have a similar distance to the acoustic transmitter device but a different orientation with respect to the acoustic transmitter device.

Other Uses of the Transmit and Receive Functionality of an Acoustic Positioning Transmitter In certain embodiments, the room response function estimation process may also be used to implement a motion detection feature or even an object positioning feature. For example, an object that is not part of the room response function, as generated by the static acoustic environment, will manifest itself as a new reflector or alternatively as a disturbance (reduction) of the signal strength of a received echo that resulted in the room response function. In addition, the Doppler component of a new path that manifests itself in the room response function may be observed. Such an observation may be used to derive the velocity component of the object that creates the new path. Embodiments that observe Doppler components permit recognition of objects such as humans, animals and the like, but without these objects needing to be equipped with a mobile device. Such a capability to monitor such passive objects is of great interest in a positioning system for mobile devices, since such a capability allows a supervision system to detect objects that are present in an indoor environment, where the objects do not have required mobile device for identification. The low power nature of the signal acquisition and the processing needed to obtain the room response function by the acoustic positioning transmitter, allows embodiments to run this process at the same update rate and optionally the same signal as the acoustic transmit signal used to position mobile devices (typically 1 Hz) while maintaining a battery life of many years. Any movement registered by the acoustic transmitter device can be send on to the positioning server using a built-in RF connection to the server with very low latency, thereby resulting in a battery powered motion monitoring system.

The inventors recognized what is needed are ultrasonic real-time locating systems that can better handle different types of mobile receiver units. One problem has been it can be difficult to include a variety of types of mobile units within a particular real-time locating system due in part to the varying operational capabilities of the various types of mobile units. For instance, some mobile units, such as smartphones, tablets or other such consumer products are not configured to receive ultrasonic signals much higher than 20 kHz, whereas other mobile units, such as various mobile units used in industrial or healthcare applications, may be configured to receive ultrasonic signals having a higher frequency. Such operational capability discrepancies can make it difficult to achieve a flexible and accurate real-time locating system using a variety of mobile receiver units. Embodiments of the disclosure described herein overcome these difficulties and provide further advantages and features.

Reference will now be made in detail to embodiments, one or more examples of which are illustrated in the drawings. Each example is provided by way of explanation of the embodiments, not limitation of the invention. In fact, it will be apparent to those skilled in the art that various modification and variations can be made to the embodiments without departing from the scope or spirit of the present disclosure. For instance, features illustrated or described as part of one embodiment can be used with another embodiment to yield a still further embodiment. Thus it is intended that aspects of the present disclosure cover such modifications and variations.

Example aspects of the present disclosure are directed to a transmitting device for use in a real-time locating system. For instance, the transmitting device may be configured to transmit acoustic signals such that the acoustic signals may be received by one or more mobile units. In some implementations, the transmitting device may be configured to transmit beacon data such that the beacon data may be received by the one or more mobile units. The acoustic signals may be ultrasonic acoustic signals (e.g. acoustic signals having a frequency greater than or equal to 20 kHz). In some implementations, the first and second acoustic signals can include identifying information associated with the transmitting device and/or location information indicating a location of the transmitting device within a particular subject area. For instance, the location data can indicate a location of the transmitting device within a particular room of a building.

More particularly, the transmitting device may include a first transducer and a second transducer. The first transducer may be configured to transmit first acoustic signals having a first frequency, and the second transducer may be configured to transmit second acoustic signals having a second frequency. In some implementations, the first frequency can be about 20 kHz, and the second frequency can be about 40 kHz. As used herein, the term "about," when used in conjunction with a numerical value is intended to refer to within 40% of the numerical value. It will be appreciated that other suitable frequencies can be used without deviating from the scope of the present disclosure. Typically the acoustic signals have a narrow band nature due to the use of highly efficient acoustic transducers to obtain adequate battery life. This means that the bandwidth of the acoustic signals is between 5-10% of the carrier frequency.

The transmitting device may further include a beacon device configured to transmit the beacon data. In some implementations, the beacon device can be implemented within the transmitting device. The beacon device may be any suitable beacon device configured to provide beacon data using any suitable wireless communication techniques. For instance, the beacon device can be a radio frequency beacon device (e.g. Bluetooth Low Energy (BLE) beacon device, Bluetooth beacon device, WiFi beacon device, WiFi Direct beacon device, near field communications beacon device, ZigBee beacon device, etc.), an infrared beacon device, or other suitable beacon device. In this manner, the beacon device can include a suitable transmitting device configured to transmit (e.g. broadcast using a suitable short-range wireless communication technology) beacon data. The beacon data can include data indicative of an identification of the transmitting device and/or data indicative of a location of the transmitting device. In some implementations, the location data included in the beacon data can be a relative location of the transmitting device within a particular subject area. The beacon data may also include information involving timing of the transmissions be it RF, ultrasonic or other.

The real-time locating system may be, for instance, an indoor positioning system. More particularly, the real-time locating system may include the transmitting device and one or more mobile units. The mobile units can be any user device, such as a smartphone, tablet computer, laptop computer, wearable computing device, or any other suitable user device capable of being carried by a user while in operation. In some implementations, the mobile units can be dedicated positioning tags configured to be affixed or attached to a person, object, or item. Such positioning tags can be operable to communicate with the transmitting device to determine a location of the positioning tags (and the corresponding person(s), object(s), or item(s) to which the positioning tags are attached.

In this manner, the transmitting device may be configured to transmit the acoustic signals and/or the beacon data within a subject area, such that one or more mobile units within the broadcast range of the transmitting device can receive the transmitted acoustic signals and/or beacon data. In some implementations, a mobile unit that receives the acoustic signals and/or beacon data can then determine a location of the mobile unit within the subject area. In some implementations, the mobile unit can provide the acoustic signals and/or beacon data to a server (e.g. via suitable wired and/or wireless communication), such that the server can determine the location of the mobile unit within the subject area based at least in part on the acoustic signals and/or beacon data.

In particular, the real-time locating system of the present disclosure may be used to determine a location, orientation and/or direction of one or more mobile units. The location, orientation, and/or direction of a mobile unit can be relative with respect to a subject area. For instance, the location of the mobile unit can be a location within a subject area. More particularly, the location can be determined with respect to the layout and dimensions of the subject area and/or a building or other entity in which the subject area is located. The location can be a three-dimensional (3D) location specifying an x-coordinate, a y-coordinate, and a z-coordinate with respect to a 3D space. In some implementations, the location can be a two-dimensional location. Aspects of the present disclosure can provide a location determination of a mobile unit that is accurate within about 6 inches to about 12 inches.

In some implementations, the transmitting device may determine whether to transmit first acoustic signals having a first frequency or second acoustic signals having a second frequency (or both) based at least in part on the capabilities of one or more mobile units associated with the real-time locating system. For instance, a selection of the first or second acoustic signals can be made based at least in part on one or more microphones (or other suitable transducers) included within the mobile units associated with the real-time locating system. As indicated above, the first acoustic signals (provided by the first transducer) can have a frequency of about 20 kHz and the second acoustic signals (provided by the second transducer) can have a frequency of about 40 kHz.

The determination of which acoustic signals to transmit (and thereby which transducer to use to transmit the signals) may be predetermined based at least in part on the known capabilities of the mobile units associated with the real-time locating system. For instance, conventional smartphones include microphones operable to receive acoustic signals having a frequency of 20 kHz. If it is known that the mobile units associated with the real-time locating system include smartphones (or other suitable mobile units operable to receive 20 kHz frequencies), the transmitting device may be operated to provide the first acoustic signals via the first transducer. In some implementations, such acoustic signal determination can be made manually by a user or other person associated with the real-time locating system, for instance, through an interaction with a user interface associated with a computing device (e.g. one or more of the computing devices described below) associated with the real-time locating system. In some implementations, the acoustic signal determination can be performed automatically based at least in part on a look-up function performed by a computing device (e.g. one or more of the computing devices described below) associated with the real-time locating system. More particularly, the computing device can access a look-up table specifying information to be used in the determination of the acoustic signals. Such look-up table can include, for instance, characteristics and/or capabilities of the mobile units associated with the real-time locating system. For instance, the look-up table can specify microphone types, characteristics, capabilities, etc. of various suitable mobile units. In some implementations, the look-up table can specify a particular frequency or transducer to use in transmitting the acoustic signals. The look-up function can be predetermined or can be determined in real-time. For instance, the transmitting device can communicate with a mobile unit to determine an identity of the mobile unit. The transmitting device can then perform the look-up function based on the identity.

The location, orientation, and/or direction of a mobile unit may be determined based at least in part on the acoustic signals received by the mobile unit. It will be appreciated that the such information may be determined using various suitable location determination techniques. For instance, the location, orientation, and/or direction of the mobile unit can be determined based at least in part on a time of flight (TOF), time difference of arrival (TDOA), angle of arrival (AOA), etc. using trilateration, multilateration, triangulation, or other suitable technique. In some implementations, the location, orientation, and/or direction of a mobile unit can be determined based at least in part on one or more position sensors implemented within or otherwise associated with the mobile unit. For instance, such information can be determined or refined using one or more accelerometers, gyroscopes, inertial measurement units, etc. located within the mobile unit, for instance, using suitable sensor fusion techniques.

In some implementations, the location, orientation, and/or direction of a mobile unit may be determined based at least in part on the beacon data provided by the transmitting device. For instance, the beacon data can be used in conjunction with the acoustic signals and/or position sensor data to determine the location, orientation, and/or direction of the mobile unit. In such implementations, the beacon data can be used by the mobile device to determine a course estimate of the location, orientation and/or direction of the mobile unit, which can be refined based at least in part on the acoustic signals and/or position sensor data. In some implementations, the beacon data can be utilized as a backup to the acoustic signals. For instance, if the acoustic signals cannot be used to determine the location of the mobile unit (e.g. if the microphone(s) on the mobile unit do not receive the acoustic signals), the beacon data can be used to determine the location orientation and/or direction of the mobile unit. Generally, the location, orientation, and/or direction of the mobile unit determined from the beacon data will not be as accurate as the location, orientation, and/or direction as determined using the acoustic signals.

As indicated above, the real-time locating system of the present disclosure provides a more accurate and efficient locating system relative to conventional real-time locating systems. More particularly, the real-time locating system of the present disclosure provides increased accuracy of within about 6 inches to about 12 inches. In this manner, the location of the mobile units can be determined on a room-by-room basis and/or on a sub-room basis, which can allow for a more accurate location tracking. Such real-time locating system requires less processing power, and a less complex infrastructure that is smaller and easily scalable. Such real-time locating system further provides near real-time latency by utilizing numerous location determination techniques (e.g. using acoustic signals, position sensor data, and/or beacon data). Such real-time locating system further provides an increased flexibility by allowing the use of various types of mobile units, as well as having the capability to provide multiple acoustic signals having multiple frequencies to accommodate for such various mobile units.

The real-time locating system of the present disclosure may be used in a number of applications, such as location tracking, work flow, mobile equipment tracking, safety and compliance (e.g. hand hygiene compliance, temperature monitoring, door locking for infant abduction protection, wander management, wayfinding, mobile equipment management, staff location determination, etc.) or other suitable application. For instance, the real-time locating system of the present disclosure can be configured to provide wayfinding information by providing routing instructions, step-by-step directions, etc. to a user from an origin to a destination. In some implementations, such wayfinding application can be used in conjunction with a mapping or routing application associated a mobile unit of a user to facilitate the wayfinding with respect to a map of a building, area, geographic region, etc. One example field of use is within the health care industry. For instance, a real-time location system of the present disclosure can be implemented within a hospital to provide patient tracking, patient flow, etc.

Figure 1:
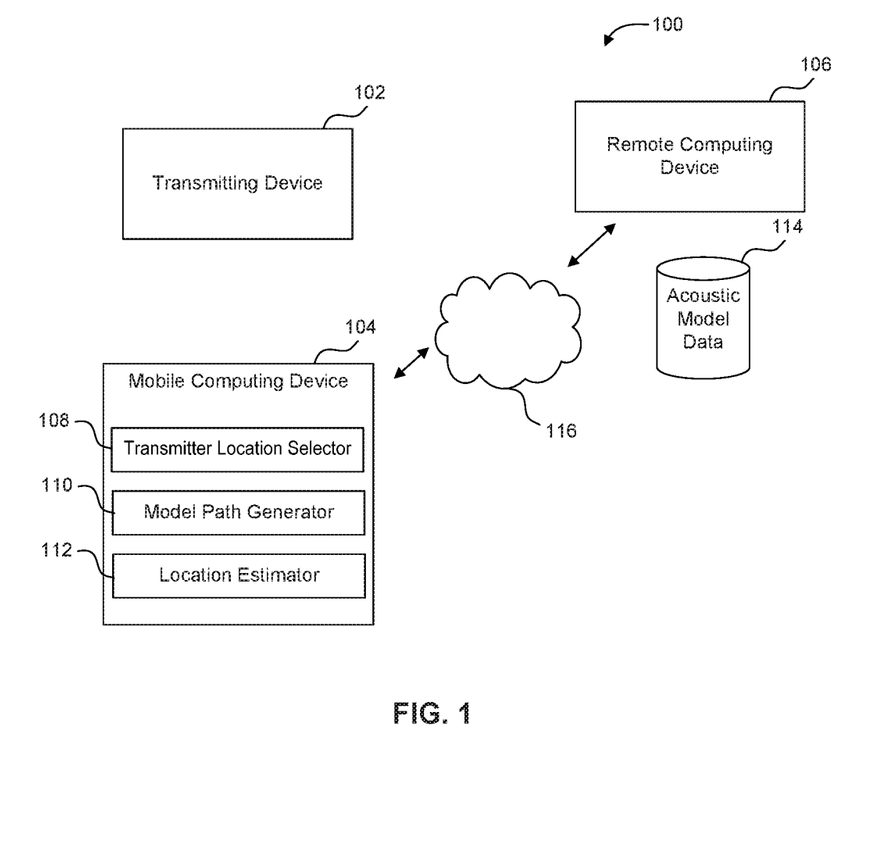
FIG. 1 depicts an example real-time locating system according to example aspects of the present disclosure.

With reference now to the figures, example aspects of the present disclosure will be discussed in greater detail. For instance, FIG. 1 depicts an example real-time locating system 100 according to example aspects of the present disclosure. The system 100 includes a mobile device 102, a transmitting device 104, and a remote computing device 106. Remote computing device 106 may be connected to transmitting device 104 by network 116. Remote computing device 106 may have access to acoustic model data 114. In various implementations, the system 100 may include one or more transmitting devices deployed throughout an environment (e.g. campus, building, room, area, etc.) in such a manner as to facilitate a location determination of one or more mobile computing devices located within the environment. The transmitting devices may be deployed in various suitable arrangements or configurations throughout the environment based on the needs or desires of the user.

Figure 2:
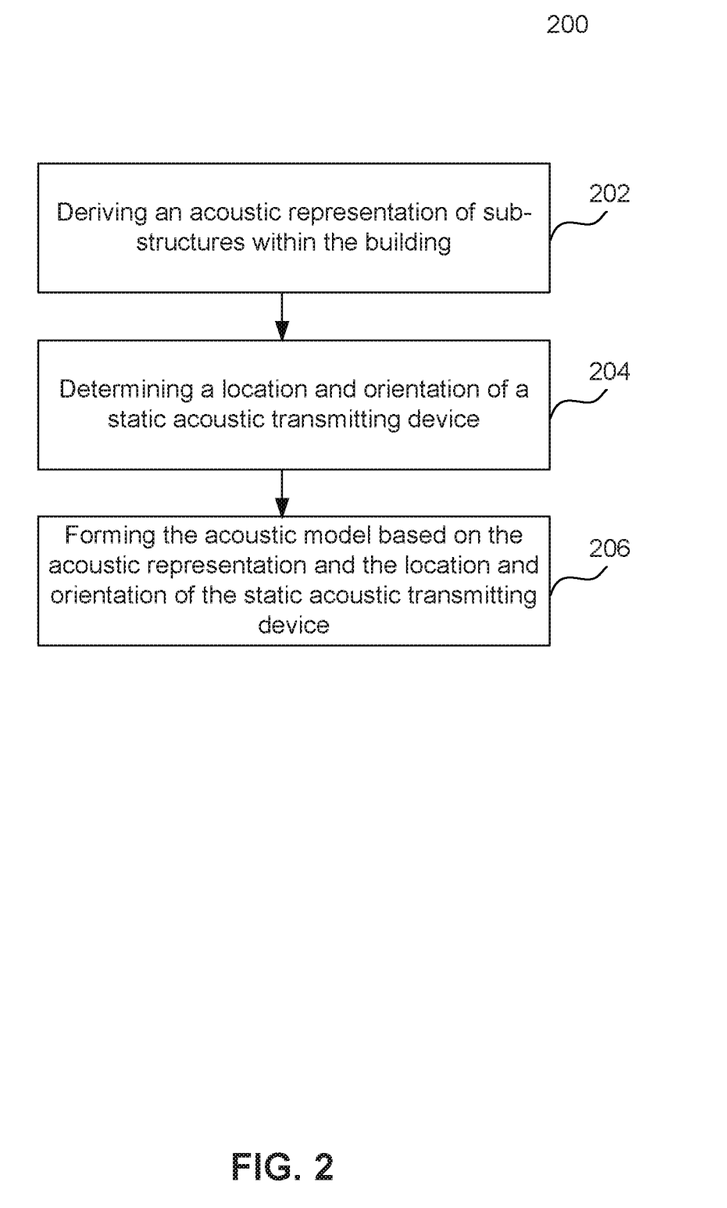
FIG. 2 depicts a flow diagram of an example method of determining an acoustic model of a building according to example aspects of the present disclosure.

FIG. 2 depicts a flow diagram of an example method (200) for determining an acoustic model of a building for use in an acoustic real-time locating system. In step 202, method 200 derives an acoustic representation of sub-structures within the building. In step 204, method 200 determines a location and orientation of a static acoustic transmitting device. In step 206, method 200 forms the acoustic model based on the acoustic representation and the location and orientation of the static acoustic transmitting device.

Figure 3:
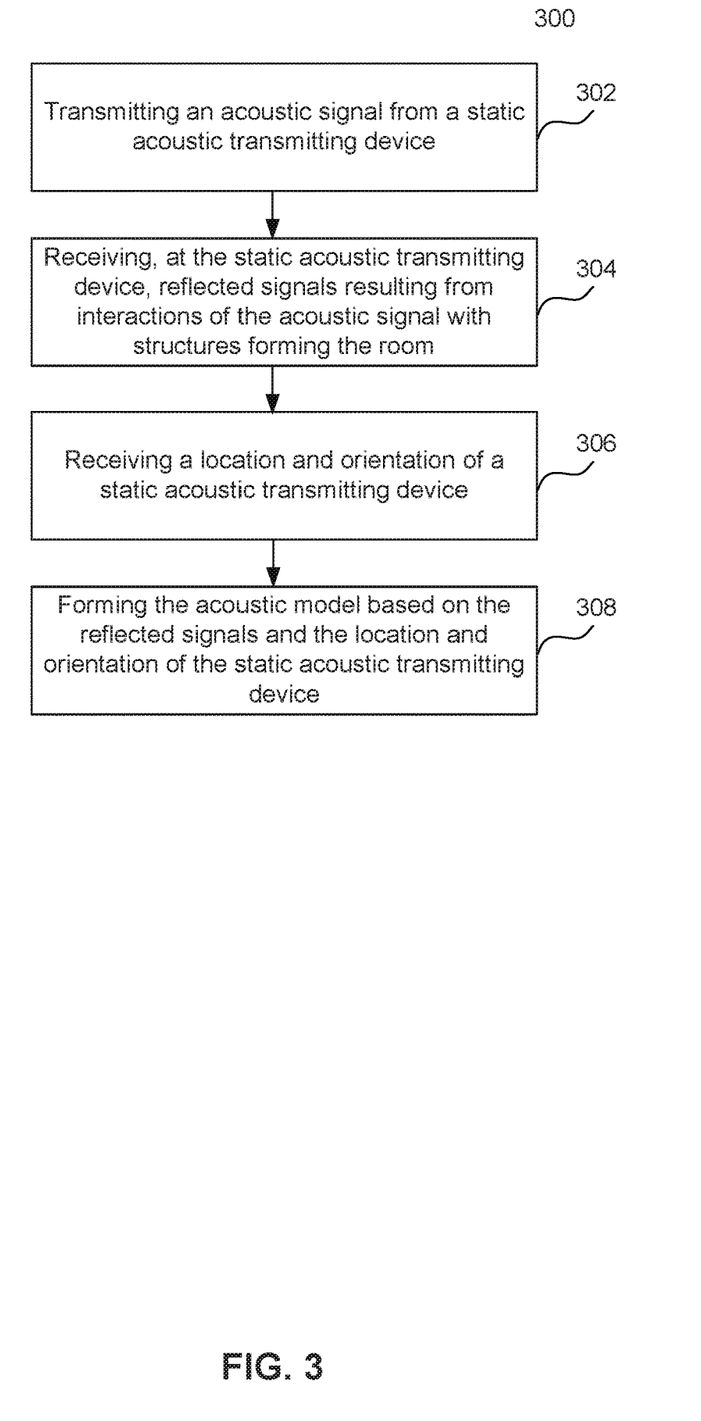
FIG. 3 depicts a flow diagram of an example method of determining an acoustic model of a room within a building according to example aspects of the present disclosure.

FIG. 3 depicts a flow diagram of an example method (300) for determining an acoustic model of a room within a building for use in an acoustic real-time locating system. In step 302, method 300 transmits an acoustic signal from a static acoustic transmitting device. In step 304, method 300 receives, at the static acoustic transmitting device, reflected signals resulting from interactions of the acoustic signal with structures forming the room. In step 306, method 300 receives a location and orientation of a static acoustic transmitting device. In step 308, method 300 forms the acoustic model based on the reflected signals and the location and orientation of the static acoustic transmitting device.

Figure 4:
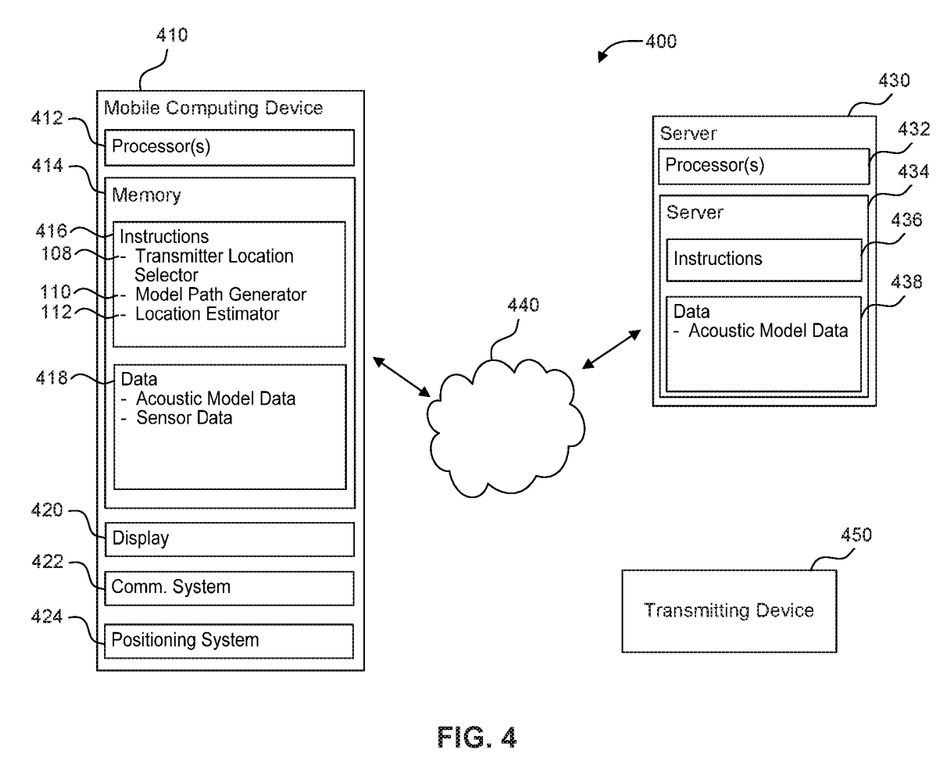
FIG. 4 depicts an example computing system according to example aspects of the present disclosure.

FIG. 4 depicts an example system 400 that can be used to implement the methods and systems of the present disclosure. In some implementations, the system 400 can be at least a portion of a real-time locating system configured to determine the locations of various suitable mobile computing devices. The system 400 can be implemented using a client-server architecture that includes a mobile computing device 410 that communicates with one or more remote computing devices, such as server 430. The system 400 can be implemented using other suitable architectures.

As shown, the system 400 can include a mobile computing device 410. The mobile computing device 410 can be any suitable type of mobile computing device, such as a smartphone, tablet, cellular telephone, wearable computing device, or any other suitable mobile computing device capable of being used in mobile operation. In some implementations, the mobile computing device can be a dedicated tag (e.g. passive or active) or other device for use in the real-time locating system. The mobile computing device 410 can include one or more processor(s) 412 and one or more memory devices 414.

The one or more processor(s) 412 can include any suitable processing device, such as a microprocessor, microcontroller, integrated circuit, logic device, one or more central processing units (CPUs), graphics processing units (GPUs) dedicated to efficiently rendering images or performing other specialized calculations, and/or other processing devices, such as a system on a chip (SoC) or a SoC with an integrated RF transceiver. The one or more memory devices 414 can include one or more computer-readable media, including, but not limited to, non-transitory computer-readable media, RAM, ROM, hard drives, flash memory, or other memory devices.

The one or more memory devices 414 can store information accessible by the one or more processors 412, including instructions 416 that can be executed by the one or more processors 412. For instance, the memory devices 414 can store the instructions 416 for implementing one or more modules configured to implement a transmitter location selector 108, a model path generator 110, and/or a location estimator 112, and/or other suitable instructions.

Each of the transmitter location selector 108, model path generator 110, and location estimator 112 can include computer logic utilized to provide desired functionality. Thus, each of the transmitter location selector 108, model path generator 110, and location estimator 112 can be implemented in hardware, application specific circuits, firmware and/or software controlling a general purpose processor. In one embodiment, each of the transmitter location selector 108, model path generator 110, and location estimator 112 are program code files stored on the storage device, loaded into memory and executed by a processor, or can be provided from computer program products, for example computer executable instructions, that are stored in a tangible computer-readable storage medium such as RAM, hard disk or optical or magnetic media. The transmitter location selector 108, model path generator 110, and location estimator 112 can each correspond to one or more different programs, files, circuits, or sets of instructions. Likewise, two or more of the transmitter location selector 108, model path generator 110, and location estimator 112 can be combined into a single program, file, circuit, or set of instructions.

The instructions 416 can further include instructions for implementing a browser, for running a specialized application, or for performing other functions on the mobile computing device 410. For instance, the specialized application can be used to exchange data with server 430 over the network 440. The instructions 416 can include client-device-readable code for providing and implementing aspects of the present disclosure. For example, the instructions 416 can include instructions for implementing an application associated with the real-time locating system, or a third party application implementing wayfinding, asset tracking, or other services on the mobile computing device 410.

The one or more memory devices 414 can also include data 418 that can be retrieved, manipulated, created, or stored by the one or more processors 412. The data 418 can include, for instance, acoustic model data, sensor data, and/or other data.

The mobile computing device 410 can include various input/output devices for providing and receiving information from a user, such as a touch screen, touch pad, data entry keys, speakers, and/or a microphone suitable for voice recognition. For instance, the mobile computing device 410 can have a display 420 for presenting a user interface to a user.

The mobile computing device 410 can further include a positioning system 424. The positioning system 424 can be any device or circuitry for determining the position of remote computing device. For example, the positioning device can determine actual or relative position by using a satellite navigation positioning system (e.g. a GPS system, a Galileo positioning system, the GLObal Navigation satellite system (GLONASS), the BeiDou Satellite Navigation and Positioning system), an inertial navigation system (e.g. using positioning sensors, such as an inertial measurement unit), a dead reckoning system, based on IP address, by using triangulation and/or proximity to cellular towers, Bluetooth hotspots, BLE beacons, Wi-Fi access points or Wi-Fi hotspots, Wi-Fi time-of-flight, and/or other suitable techniques for determining position.

The mobile computing device 410 can also include a network interface used to communicate with one or more remote computing devices (e.g. server 430) over a network 440. The network interface can include any suitable components for interfacing with one more networks, including for example, transmitters, receivers, ports, controllers, antennas, or other suitable components.

The mobile computing device 410 can further include a communication system 422 used to communicate with one or more transmitting devices, such as transmitting device 450. The communication system 422 can include, for instance, one or more transducers (e.g. microphone devices) configured to receive acoustic (e.g. ultrasonic) signals from the transmitting device 450.

In some implementations, the mobile computing device 410 can be in communication with a remote computing device, such as a server 430 over network 440. Server 430 can include one or more computing devices. The server 430 can include one or more computing devices, and can be implemented, for instance, as a parallel or distributed computing system. In particular, multiple computing devices can act together as a single server 430.

Similar to the mobile computing device 410, the server 430 can include one or more processor(s) 432 and a memory 434. The one or more processor(s) 432 can include one or more central processing units (CPUs), and/or other processing devices. The memory 434 can include one or more computer-readable media and can store information accessible by the one or more processors 432, including instructions 436 that can be executed by the one or more processors 432, and data 438. For instance, although the transmitter location selector 108, model path generator 110, and location estimator 112 are depicted in FIG. 4 as being included in the mobile computing device 410, in other implementations, one or more of the transmitter location selector 108, model path generator 110, and location estimator 112 can be included in the server 430.

The data 438 can be stored in one or more databases. The data can include acoustic model data and other data. The one or more databases can be connected to the server 430 by a high bandwidth LAN or WAN, or can also be connected to server 430 through network 440. The one or more databases can be split up so that they are located in multiple locales.

Server 430 can also include a network interface used to communicate with computing device 410 over network 440. The network interface can include any suitable components for interfacing with one more networks, including for example, transmitters, receivers, ports, controllers, antennas, or other suitable components.

Network 440 can be any type of communications network, such as a local area network (e.g. intranet), wide area network (e.g. Internet), cellular network, or some combination thereof. Network 440 can also include a direct connection between the mobile computing device 410 and server 430. Network 440 can include any number of wired or wireless links and can be carried out using any suitable communication protocol.

The system 400 can further include one or more transmitting devices, such as transmitting device 450. The transmitting device 450 can transmit acoustic signals (e.g. ultrasonic signals) such as described with regard to transmitting device 104 in FIG. 1. In some implementations, the transmitting device 450 can transmit other suitable signals, such as radio frequency signals. The transmitting device 450 can be implemented using any suitable computing device(s). The transmitting device 450 can include one or more transducers configured to emit acoustic or other suitable signals that can be used by the mobile computing device 410 to facilitate a location estimation of the mobile computing device 410 according to example aspects of the present disclosure. Although only one transmitting device is depicted in FIG. 4, it will be appreciated by those skilled in the art that any suitable number of transmitting devices can be included in the system 400.

The technology discussed herein makes reference to servers, databases, software applications, and other computer-based systems, as well as actions taken and information sent to and from such systems. One of ordinary skill in the art will recognize that the inherent flexibility of computer-based systems allows for a great variety of possible configurations, combinations, and divisions of tasks and functionality between and among components. For instance, server processes discussed herein may be implemented using a single server or multiple servers working in combination. Databases and applications may be implemented on a single system or distributed across multiple systems. Distributed components may operate sequentially or in parallel.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A computer-implemented method for determining an acoustic model of a room within a building for use in an acoustic real-time locating system, the method comprising:
    transmitting an acoustic signal from a static acoustic transmitting device;
    receiving, at the static acoustic transmitting device, reflected signals resulting from interactions of the acoustic signal with structures forming the room;
    receiving a location and orientation of a static acoustic transmitting device; and
    forming the acoustic model based on the reflected signals and the location and orientation of the static acoustic transmitting device, wherein the forming the acoustic model further includes alias mixing the reflected signals.

2. The computer-implemented method of claim 1, wherein the static acoustic transmitting device further includes a first transducer and a second transducer, the transmitting further includes transmitting the acoustic signal at a first frequency using the first transducer, the method further comprising:
    transmitting a second acoustic signal at a second frequency from the static acoustic
    transmitting device using the second transducer.

3. The computer-implemented method of claim 2, wherein the first transducer and the second transducer have different orientations.

4. The computer-implemented method of claim 2, wherein the first transducer and the second transducer have different signal directivities.

5. The computer-implemented method of claim 2, wherein the first frequency is about 20 kHz.

6. The computer-implemented method of claim 2, wherein the second frequency is about 40 kHz.

7. The computer-implemented method of claim 2, wherein at least one of the first transducer or the second transducer is a piezo-electric transducer.

8. The computer-implemented method of claim 1, further comprising:
    detecting a motion of an object within the room based on determining a Doppler shift in the acoustic signal.

9. The computer-implemented method of claim 1, further comprising:
    detecting a presence of an object within the room based on an identification of a new reflector or determination of a disturbance of a signal strength of a reflected signal.

10. The computer-implemented method of claim 1, wherein the static acoustic transmitting device uses ultrasonic acoustic signals.

11. The computer-implemented method of claim 1, wherein the static acoustic transmitting device further includes a beacon device, the method further comprising transmitting, by the beacon device, beacon data using a wireless transmission.

12. The computer-implemented method of claim 11, wherein the beacon device is a Bluetooth Low Energy (BLE) beacon device.

13. The computer-implemented method of claim 11, wherein the beacon device is a Bluetooth beacon device.

14. The computer-implemented method of claim 11, wherein the beacon device is a WiFi beacon device.

15. The computer-implemented method of claim 11, wherein the beacon device is a Zigbee beacon device.

16. The computer-implemented method of claim 11, wherein the beacon device is a near field communications beacon device.

17. The computer-implemented method of claim 11, wherein the beacon data is indicative of an identification of the static acoustic transmitting device.

18. The computer-implemented method of claim 11, wherein the beacon data is indicative of a location of the static acoustic transmitting device.

19. The computer-implemented method of claim 11, wherein the beacon data is indicative of a location of the static acoustic transmitting device within a particular subject area.

20. The computer-implemented method of claim 11, wherein the beacon data includes information involving timing of transmissions of at least one of the acoustic signal or an radio frequency (RF) signal.

* * * * *

UNITED STATES PATENT AND TRADEMARK OFFICE
CERTIFICATE OF CORRECTION

PATENT NO. : 11,875,089 B2  
APPLICATION NO. : 16/288606  
DATED : January 16, 2024  
INVENTOR(S) : Booij et al.

Page 1 of 1

It is certified that error appears in the above-identified patent and that said Letters Patent is hereby corrected as shown below:

In the Claims

In Column 17, Claim 2, Line 19, after "a second transducer,", insert --and--.

In Column 17, Claim 2, Line 25, delete "transmitting device using the second transducer." and insert the same at Line 24, after "static acoustic" as a continuation point.

In Column 18, Claim 14, Line 21, delete "WiFi" and replace with --Wi-Fi--.

Signed and Sealed this  
Fifth Day of March, 2024

Katherine Kelly Vidal  
*Director of the United States Patent and Trademark Office*